United States Patent [19]
Eness

[11] Patent Number: 4,792,991
[45] Date of Patent: Dec. 20, 1988

[54] FM RECEIVER HAVING IMPROVED AUDIO QUALITY IN RESPONSE TO RAYLEIGH FADED RECEIVED SIGNALS

[75] Inventor: Orville M. Eness, Park Ridge, Ill.

[73] Assignee: Motorola, Inc., Schaumburg, Ill.

[21] Appl. No.: 124,409

[22] Filed: Nov. 18, 1987

Related U.S. Application Data

[63] Continuation of Ser. No. 847,964, Apr. 3, 1986, abandoned.

[51] Int. Cl.$^4$ .......................... H04B 1/16; H04B 1/10
[52] U.S. Cl. .................................. 455/210; 455/214; 455/243; 455/245
[58] Field of Search ............... 455/136, 138, 205, 210, 455/211, 214, 240–243, 245, 266, 249; 329/131, 134

[56] References Cited

U.S. PATENT DOCUMENTS

| | | | |
|---|---|---|---|
| 3,036,211 | 5/1962 | Broadhead | 250/20 |
| 3,832,638 | 8/1974 | Ohashi et al. | 455/210 |
| 3,982,186 | 9/1976 | Furuno | 455/210 |
| 4,013,964 | 3/1977 | Skutta | 325/319 |
| 4,123,711 | 10/1978 | Chow | 325/62 |
| 4,313,215 | 1/1982 | Jansen | 455/212 |
| 4,379,207 | 4/1983 | Kubota | 179/1 GJ |
| 4,393,354 | 7/1983 | McGinn | 330/280 |
| 4,403,348 | 9/1983 | Leland et al. | 455/203 |
| 4,450,590 | 5/1984 | Lafferty | 455/214 |
| 4,466,129 | 8/1984 | Skutta | 455/219 |
| 4,580,286 | 4/1986 | Richards, Jr. | 455/168 |
| 4,648,126 | 3/1987 | Toffolo | 455/212 |
| 4,648,127 | 3/1987 | Jongepier | 455/212 |

FOREIGN PATENT DOCUMENTS 657528  3/1938  Fed. Rep. of Germany .

OTHER PUBLICATIONS

*Signetics Analog Applications Manual*, 1979, pp. 225–232.
"Performance of a Two Branch Post-Detection Combining UHF Mobile Radio Space Diversity Receiver", thesis by Anthony J. Rustako, Jr., 1969, pp. 26–29, 38–40, 43–50, 53–58.
"FM Noise with Fading Channels and Diversity", by Bruce R. Davis, IEEE Transactions on Communication Technology, vol. Com-19, No. 6, Dec. 1971, pp. 1189–1200.
"An FM Detector for Low S/N", by John H. Park, Jr., IEEE Transactions on Communication Technology, vol. Com-18, No. 2, pp. 110–111, Apr. 1970.
*Angle Modulation: The Theory of System Assessment*, by J. H. Roberts, 1977, pp. 204–213.
"Simplified Baseband Diversity Combiner", by R. T. Adams, IRE Transactions on Communications Systems, Dec. 1960.
"Multiplication by Square of Envelope as Means of Improving Detection Below FM Threshold", by J. H. Roberts, IEEE Transactions on Communication Technology, Jun. 1971, pp. 349–353.
"Variants of Conventional FM Demodulation Having the Aim of Improving Poor Signal-To-Noise Ratios", by John H. Roberts, Proceedings of Radio Receivers and Associated Systems, IEE Conference, Jul. 1972.
"Voice and Digital Transmission in a Mobile Radio Channel at 850 MHz (A Tutorial Presentation)", by G. A. Arredondo and J. I. Smith, NEC Proceedings, 1974, pp. 74–79.

(List continued on next page.)

Primary Examiner—Robert L. Griffin
Assistant Examiner—Ralph E. Smith
Attorney, Agent, or Firm—Charles L. Warren

[57] ABSTRACT

The present invention minimizes noise pops due to Rayleigh fades by controlling receiver gain relative to the average received signal strength so that only a predetermined level of limiting occurs prior to the recovery of the audio information. The amount of limiting is selected so that a significant Rayleigh fade will cause the amplified IF signal to drop below the limiting level and enter the linear amplification region. During the fade the magnitude of the signal provided to the discriminator decreases thereby decreasing the discriminator's output and minimizing the magnitude of the audio pop. Additional minimization of the subject noise pops is achieved by utilizing a discriminator which has a square law transfer characteristic so that the recovered audio level will decrease 2 dB for every 1 dB decrease in input signal level.

21 Claims, 3 Drawing Sheets

OTHER PUBLICATIONS

"Reduction of Threshold Noise in FM Receivers Operating in Quasisynchronous Field", by M. O. Al-Nuaimi, B.Sc., Ph.D., C. Eng., MIEE, IEE Proceedings, vol. 132, Pt. F, No. 2, Apr. 1985.

David Middleton, "On Theoretical Signal-to-Noise Ratios in FM Receivers: A Comparison with Amplitude Modulation", Journal of Applied Physics.

Copies of Selected Portions of the Manual for General Electric's Cellular Personal Radio MT-391FOR6A.

Heinz Ammon et al., "High Performance FM-IF IC for Systems with Search Tuning Stop and Multipath Interference Detection", IEEE Transactions on Consumer Electronics (Aug. 1986), Section 2.3.

FM RECEIVER HAVING IMPROVED AUDIO QUALITY IN RESPONSE TO RAYLEIGH FADED RECEIVED SIGNALS

This is a continuation of application Ser. No. 847,964, filed Apr. 3, 1986, now abandoned.

BACKGROUND OF THE INVENTION

This invention relates to an improvement in FM receivers and more specifically is directed to improving the audio sound quality by reducing the magnitude of audible pops that occur during input signal minimums caused by Rayleigh faded received signals. This invention is especially effective for FM systems which utilize peak deviations of less than 5.0 kHz.

Conventional FM receivers utilize sufficient intermediate frequency (IF) amplification so that the received signal as carried by the IF is in full "limiting" prior to a discriminator converting the FM information into audio. Limiting refers to the nonlinear amplification of the signal such as by an amplifier going into saturation or cut-off, or by a clipping circuit. The reason for utiliiing limiting is to remove amplitude signal variations prior to the recovery of the desired information by the discriminator because the discriminator is responsive to amplitude variations as well as frequency variations. Thus, limiting minimizes amplitude variations associated with the received signal. In conventional FM receivers, the total signal amplification or gain prior to recovery by the discriminator is normally set such that ambient noise in the passband of the receiver in the absence of desired RF signal is sufficient to cause limiting. Thus, it is apparent that a desired received signal which may be many decibels (dB) above the noise threshold will be in hard limiting.

In order to appreciate this invention the concept of a Rayleigh faded signal must be understood. Rayleigh fading refers to rapid fluctuations in the magnitude and/or phase of the received signal. A Rayleigh faded signal is most objectionable to a listener when the magnitude of a fade is great enough to cause a substantial momentary decrease in the signal-to-noise ratio. This results in the listener hearing an objectionable noise burst or "pop". A common example of Rayleigh fading occurs when a mobile radio user travels down a highway while receiving a signal having rapid and substantial magnitude fluctuations in field strength. Such fluctuations may be caused by out of phase reflections which result in field strength variations at the vehicle's mobile antenna.

The undesired audio responses due to Rayleigh fading become more objectionable as the peak transmitted deviation decreases and the carrier frequency increases. Deviation is a factor because it is related to the signal-to-noise ratio. In order to achieve the given level of audio output, more receiver gain will be required in a system having smaller peak deviation. Because this gain also amplifies the undesired noise burst, an audio pop is heard during a null produced by a Rayleigh fade. The pop is louder and hence more objectionable in a lower deviation system because more gain is utilized. Since wavelength decreases as frequency increases, a larger number of signal strength nulls exist to be encountered by a mobile radio operating at higher frequencies. Thus, at higher frequencies more frequent audio pops are likely.

Since the available frequency spectrum is limited and there continues to be an increasing demand for wireless communication channels, it is apparent that better utilization of the current available communication channels is desired. One way to better utilize the existing channel allocations is to divide the current channel bandwidths and provide more narrowband channels. For example, if an existing 25 kHz channel was divided in half, two 12.5 kHz channels could exist. Obviously narrower channels require that transmitted signals occupy less bandwidth. Decreasing the peak deviation from 5 kHz to 2.5 kHz in an FM system is one way to reduce the bandwidth of the transmitted signal in order to create more communication channels. New communication channels are becoming available at higher frequencies. Thus, the likelihood of having smaller deviation systems at higher frequencies makes the audio pop problem associated with Rayleigh fades a significant problem.

SUMMARY OF THE INVENTION

It is an object of this invention to minimize the noise burst problems associated with a Rayleigh faded signal in an FM communication system.

This invention is especially, but not exclusively, suited for minimizing noise pops due to Rayleigh fading in an FM system utilizing a peak deviation of less than 5 kHz.

The present invention minimizes the subject noise pops by controlling receiver gain relative to the average received signal strength so that only a predetermined level of limiting occurs prior to the recovery of the audio information such as by a discriminator. The amount of limiting is selected so that a significant Rayleigh fade will cause the amplified signal to drop below the limiting level and enter the linear amplification region. During the fade th magnitude of the signal provided to the discriminator decreases thereby decreasing the discriminator's output and minimizing the magnitude of the audio pop.

This invention further contemplates an additional minimization of Rayleigh generated noise pops by utilizing a discriminator which has a square law transfer characteristic. That is, the recovered audio output will decrease 2 dB for every 1 dB drop in input signal level to the discriminator. Since the level of limiting is predetermined, substantial Rayleigh fades decrease the magnitude of the input signal below the level where limiting occurs causing the input signal to the discriminator to decrease, thereby resulting in a square law decrease in the discriminator's output. Hence, noise bursts are provdded less overall amplification by the receiver than desired received signals. This has the property of minimizing the magnitude of the momentary nosse pops which occur due to Rayleigh fading.

DETAILED DESCRIPTION OF THE PREFERRED EMBODIMENT

Figure 1:
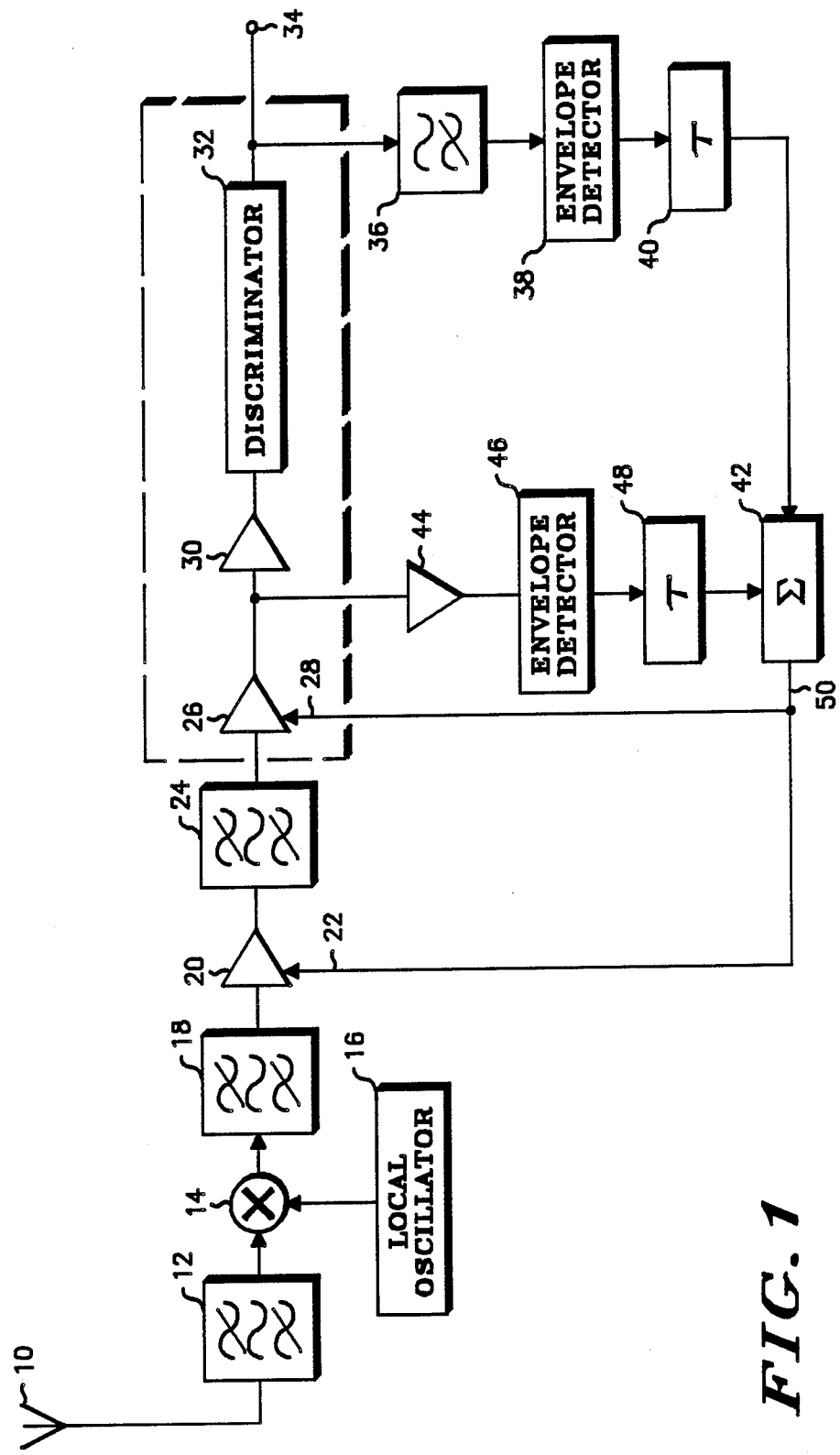
FIG. 1 is a block diagram illustrating an improved FM receiver according to the present invention.

Referring to FIG. 1, an antenna 10 couples received signals to a bandpass filter 12 which passes the filtered signal to a mixer 14. The output from the mixer provides an IF signal which is filtered by another bandpass filter 18 before being amplified by amplifier 20. It should be noted that the gain of amplifier 20 is controlled in response to an input 22. The output of amplifier 20 is filtered by another bandpass filter 24 before being coupled to amplifier 26. Amplifier 26 is similar to amplifier 20 in that it has its gain control by means of an input 28. The signal is further amplified by amplifier 30 prior to being coupled to discriminator 32. It will be apparent to those skilled in the art that the input to the discriminator from amplifier 30 consists of a frequency modulated signal and that the output 34 of the discriminator consists of the demodulated audio signal.

The output 34 from the discriminator is coupled to a highpass filter 36 whose output is coupled to an envelope detector 38. The purpose of this detector is to detect and track the peak audio amplitude of the high frequency (above 4 kHz) portion of the output from the discriminator. A time constant or delay circuit 40 smoothes the output from detector 38 and has an output which is coupled to a summation network 42.

The output from amplifier 26 is further amplified by amplifier 44 which has its output connected to envelope detector 46. The purpose of envelope detector 46 is similar to that of detector 38, that is, it detects and tracks the peak magnitude of the IF signal. The peak detected output from detector 46 is coupled to a time constant or delay network 48 which has its output coupled to summation network 42. The output 50 of the summation network consists of the sum of the inputs from delay circuits 40 and 48. The output 50 provides an automatic gain control (AGC) signal to inputs 22 and 28 to control the gain of amplifiers 20 and 26, respectively.

It is an important aspect of the present invention to provide a signal to the discriminator which has only a predetermined level limiting. It has been empirically determined, based upon judging the audio quality of Rayleigh faded signals, that 5–20 dB of limiting is suitable and that 10–15 dB is preferred. For example, 8 dB of limiting is achieved by increasing the input signal to amplifier 30 to 8 dB beyond the input level where the output of amplifier 30 becomes nonlinear, i.e., limits.

In order to maintain the input signal to the discriminator at the desired level of limiting, the gains of amplifiers 20 and 26 are controlled by their inputs 22 and 28, respectively, by the AGC signal from summation circuit 42. The elements 44, 46 and 48 control the AGC signal except when no input signal is present or when the desired input signal is at a minimal or threshold level such as approximately 12 dB SINAD or below. When threshold or no signal conditions exist, elements 36, 38 and 40 are active and generate the AGC signal. The generation of the AGC signal is described below.

The gain of amplifier 44 is selected so that the input to envelope detector 46 remains linear for all received signal levels. Envelope detector 46 provides peak level detection which is smoothed by a time constant circuit 48 which may consist of an RC circuit having a time constant substantially greater than the duration of a Rayleigh fade, such as approximately 1 second. The output from circuit 48 provides a signal corresponding to the average magnitude of the received signal. This signal is coupled through summation network 42 and is utilized to control the gain of amplifiers 20 and 26 so that the proper amount of amplification is provided in order to maintain the predetermined limiting level. For example, the average carrier signal being received by a mobile will continue to increase as the mobile drives toward the transmitting antenna. As the average signal continues to increase, the AGC signal will provide AGC of amplifiers 20 and 26 to reduce the amplification so that the predetermined limiting level is maintained. It may be desirable to control the gains of amplifiers 20 and 26 in a relationship other than a simultaneous gain reduction in order to maintain the best possible receiver noise figure. That is, the gain of amplifier 26 could be reduced to a predetermined level prior to reducing the gain of amplifier 20. This is referred to in the art as "delayed" AGC action.

The elements 36, 38 and 40 provide an additional AGC signal which further reduces the gain of the receiver for marginal signals near the noise threshold. The output from the discriminator is highpass filtered by filter 36 prior to being peak detected by detector 38. The purpose of this filter is to remove the normal audio content such as below 4 kHz an have the detector 38 act only upon the higher frequency noise. The time constant associated with delay circuit 40 is selected to be relatively short, such as approximately 1 millisecond, so that the AGC signal component corresponding to this circuit follows the magnitude of the recovered audio even during a Rayleigh fade. In marginal signal conditions it has been found that this fast acting gain control produces a better sounding audio output. Except for marginal received signal levels the high frequency components of output 34 will have a very small amplitude and this circuit (i.e. elements 36, 38, 40) will not contribute to the AGC signal.

The range of useful limiting in accord with this invention is a compromise between no limiiing (providing the discriminator with a linear input) and hard limiting (limiting on noise) as employed by conventional FM receivers. It has been empirically determined that for limiting ranges below 5 dB where the input to the discriminator is approaching linear, the resulting recovered audio includes unpleasant and undesired amplitude variations caused by random FM signals superimposed upon the desired signal. At limiting levels greater than 15 dB and especially for levels greater than 20 dB, the benefit of minimizing noise pops due to Rayleigh fading is degraded such that substantial noise pops can still occur.

Figure 2:
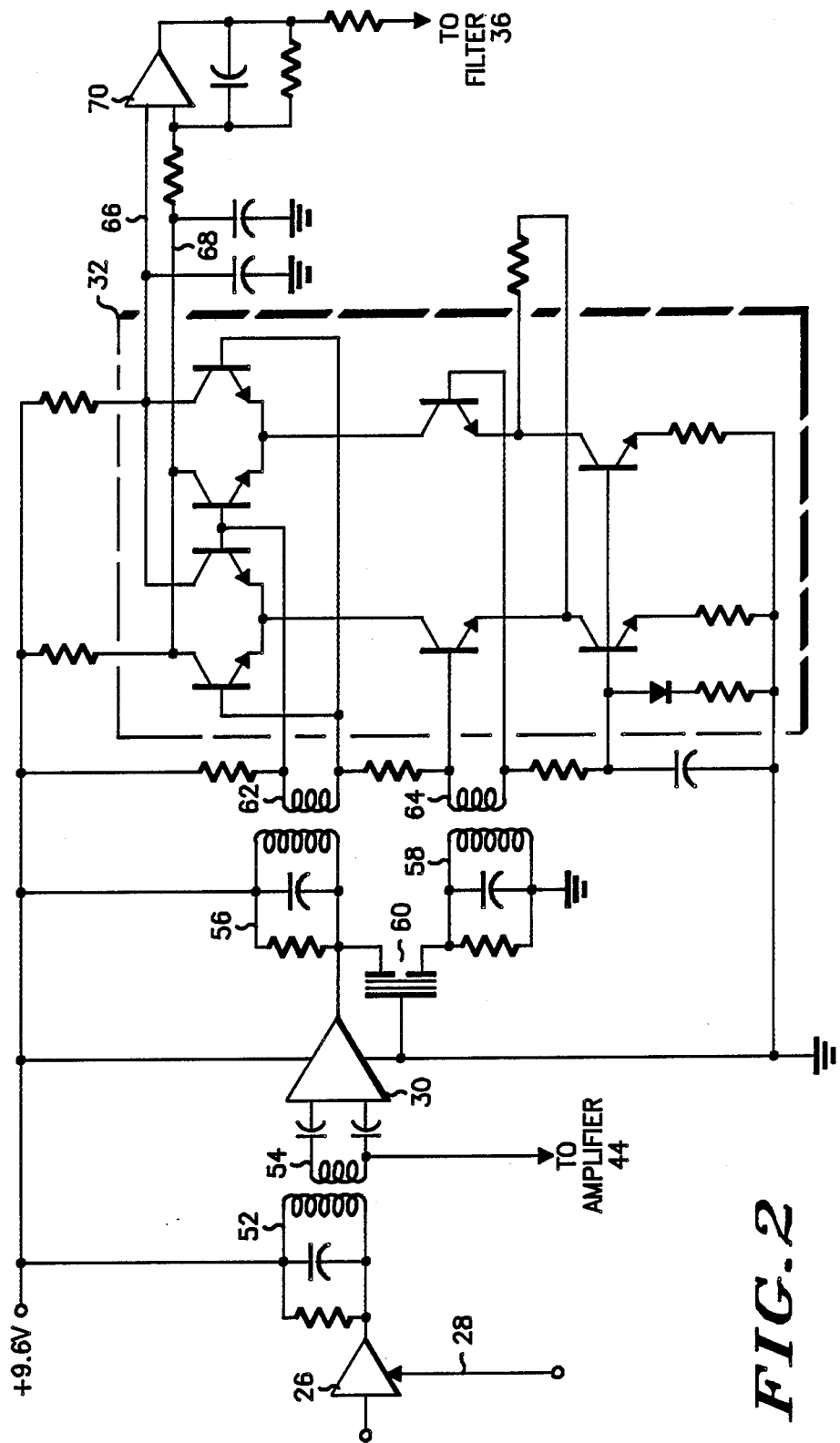
FIG. 2 is a schematic iagram of that portion of the receiver shown in FIG. 1 enclosed in dashed lines.

FIG. 2 is a schematic of the circuitry seen in FIG. 1 enclosed by the dashed lines. The output of amplifier 26 is coupled by means of a tuned circuit 52 and inductive coupling 54 to amplifier 30. The output of amplifier 30 is coupled to a tuned circuit 56 and is also coupled to a tuned circuit 58 through a crystal filter 60. The input 62 and 64 to balanced demodulator 32 have signals coupled from tuned circuits 56 and 58, respectively. Tuned circuit 58 and crystal filter 60 provide a 90° phase shift of the signal coupled from circuit 56. Balanced demodulator 32 functions as a quadrature demodulator and provides balanced outputs 66 and 68 carrying the audio information in response to phase variations of the 90° out of phase FM signals applied to input 62 and 64. This demodulator 32 functions as a discriminator. Such a demodulator is commonly available such as an integrated circuit MC1596. An output amplifier 70 receives the balanced outputs 60 and 68 and provides a single ended output audio signal which is coupled to filter 36 as well as providing audio which can be further amplified by an audio amplifier (not shown).

The discriminator 32 illustrated in FIG. 2 provides an audio output which is determined by the two out of phase inputs. The discriminator provides a square law response, that is, the audio will change 2 dB for each 1 dB input change since each input to the discriminator contributes equally to the output.

The use in this invention of a discriminator having the above described characteristic provides additional minimization of audio noise pops due to Rayleigh phase. This occurs because as a Rayleigh fade causes the signal to the discriminator to come out of limiting (and enter the linear region), each dB decrease in the signal to the discriminator corresponds to a 2 dB audio reduction. This effectively provides attenuation during a fade which results in a better sounding audio output as contrasted with a conventional receiver. Although the illustrated embodiment uses a square law characteristic, those skilled in the art may use other circuits and techniques to achieve other characteristics. A rate of change greater than 1 is beneficial since it results in increased noise attenuation.

Figure 3:
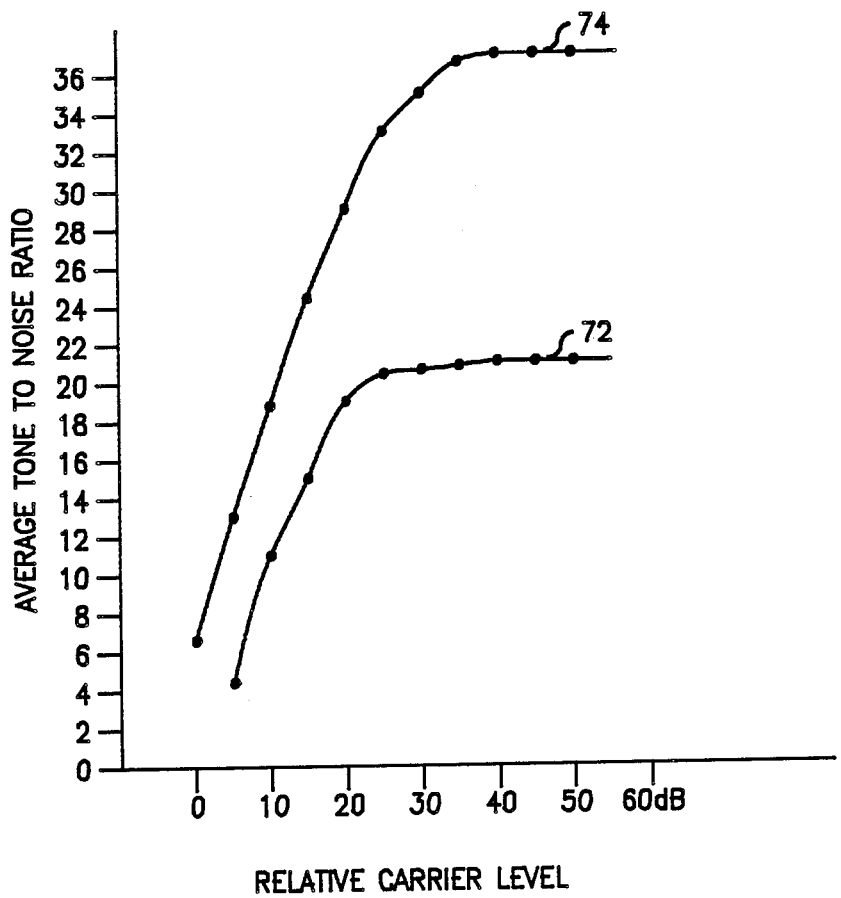
FIG. 3 is a graph illustrating the average tone-to-noise ratio relative to carrier level for an FM receiver embodying the concepts of the present invention and for a conventional FM receiver.

FIG. 3 graphically represents the improved performance of an FM receiver utilizing the present invention as contrasted against a convnntional FM receiver. Curve 72 represents the average tone-to-noise ratio versus carrier level for a conventional FM receiver having full limiting upon noise (no signal conditions). Curve 74 illustrates the average tone-to-noise ratio versus carrier level for an FM receiver incorporating the present invention. The knee of curve 72 occurs at an average tone-to-noise ratio of approximately 20 and at a relative carrier level of approximately 22 dB. The knee of curve 74 occurs at slightly above an average tone-to-noise ratio of 36 and at a relative carrier level of approximately 35 dB. For relative carrier levels of approximately 15 dB and less, a receiver according to the present invention has an tone-to-noise ratio of approximately 8 dB better than the conventional receiver. At a relative carrier level of 40 dB and above, a receiver according to the present invention has an average tone-to-noise ratio of approximately 16 dB greater than that of a conventional radio.

The curves in FIG. 3 represent a 2.5 kHz peak deviation receivers measured at 1.5 kHz peak deviation with 1 kHz audio tone modulation. Simulated Rayleigh fading having a maximum Doppler frequency of approximately 54 Hz was utilized to simulate the fading which might be encountered by a vehicle traveling at approximately 40 miles per hour while receiving a signal at 900 MHz.

The curves presented in FIG. 3 are intended to merely provide a visual representation of the improved audio response achieved by utilization of the present invention. While FIG. 3 does illustrate the benefits of the present invention, it is difficult to fully represent the subjective improvement in audio quality and iistening comfort achieved by the present invention by purely visual means.

An important contribution of this invention is the recognition and understanding of the problem relating to noise pops due to Rayleigh fading. More specifically, the appreciation of the cause and effect relationship of Rayleigh fades and FM receiver circuit operation provided by this invention, as well as the solution, are important aspects of the present invention when considered as a whole.

It will be apparent to those skilled in this art that various receiver configurations and audio recovery techniques can be utilized to recover frequency or phase modulated signals while still making use of the present invention. Although the exemplary embodiment of this invention maintain a predetermined limiting level by controlling the average magnitude of the received signal relative to a fixed limiting threshold, it is contemplated that the threshold at which limiting occurs could be varied relative to the average signal level to achieve a predetermined limiting level. Although the embodiment of the present invention has been described and illustrated herein, the scope of the present invention is defined by the claims appended hereto.

I claim:

1. In an FM receiver having an improved audio output response to Rayleigh faded received signals including means for amplifying a received FM signal, means for limiting said amplified FM signal, and discriminator means for converting the limited FM signal into an audio signal, the improvement comprising:
   means for generating a control signal corresponding to the average magnitude of the received signal; and
   AGC means for controlling the magnitude of amplification provided by said amplifying means so that a predetermined level of limiting by said limiting means is maintained in response to said control signal, said predetermined leveloof limiting being within the range of 5-20 dB of limiting.

2. The FM receiver according to claim 1 wherein said predetermined level of limiting is within the range of 10-15 dB of limiting.

3. The FM receiver according to claim 1 wherein said generating means comprises means for detecting the peak magnitude of said amplified received signal and providing an output signal corresponding to said peak magnitude, and circuit means for time averaging said output signal to provide said control signal.

4. The FM receiver according to claim 3 wherein said output signal is time averaged for a time interval substantially longer than the time duration of a Rayleigh fade.

5. The FM receiver according to claim 1 further comprising a highpass filter coupled to said discriminator means for passing frequencies above the audio range, means coupled to said filter for detecting the peak magnitude of said high frequencies passing through said filter and providing a smoothed signal corresponding to said peak high frequency magnitude, and summation means for summing said control signal and said smoothed signal.

6. The FM receiver according to claim 1 wherein said discriminator means has a transfer characteristic where the ratio of the magnitude of said audio signal output by said discriminator means to the magnitude of the limited FM signal input to the discriminator means is greater than 1.

7. The FM receiver according to claim 6 wherein said transfer characteristic substantially follows a square law characteristic.

8. A receiver having an improved audio output response to Rayleigh faded received FM signals comprising:
   means for amplifying the received FM signal;
   means for limiting said amplified FM signal;

discriminator means for converting the limited FM signal into an audio signal; and means for maintaining a predetermined limiting level relative to the average amplitude of the received signal, said predetermined level of limiting being within the range of 5-20 dB of limiting.

9. The receiver according to claim 8 wherein said predetermined level of limiting is within the range of 10-15 dB of limiting.

10. The receiver according to claims 8 wherein said maintaining means comprises means for generating a control signal corresponding to the average magnitude of the received signal, and AGC means for controlling the magnitude of amplification of said received signal so that said predetermined level of limiting is maintained in response to said control signal.

11. The receiver according to claim 10 wherein said generating means comprises means for detecting the peak magnitude of said amplified received signal and providing an output signal corresponding to said peak magnitude, and circuit means for time averaging said output signal to provide said control signal.

12. The receiver according to claim 11 wherein said output signal is time averaged for a time interval substantially longer than the time duration of a Rayleigh fade.

13. The receiver according to claim 10 further comprising a highpass filter coupled to said discriminator means for passing frequencies above the audio range, means coupled to said filter for detecting the peak magnitude of said high frequencies passing through said filter and providing a smoothed signal corresponding to said peak high frequency magnitude, and summation means for summing said control signal and said smoothed signal.

14. The receiver according to claim 8 wherein said discriminator means has a transfer characteristic where the ratio of the magnitude of said audio signal output by said discriminator means to the magnitude of the limited FM signal input to said discriminator means is greater than 1.

15. The receiver according to claim 14 wherein said transfer characteristic consists substantially of a square law response.

16. A method for minimizing noise bursts in the audio output of an FM receiver due to Rayleigh faded received signals comprising the steps of:

receiving an FM signal;

amplifying the received signal;

limiting the amplified signal prior to converting the FM signal into an audio signal; and maintaining a predetermine level of limiting relative to the average amplitude of the received signal, the predetermined level of limiting being within the range of 5-20 dB of limiting.

17. The method according to claim 16 wherein said step of maintaining the limiting to a predetermined level comprises the steps of generating a control signal which corresponds to the average amplitude of the received signal, and controlling the amount of amplification in response to the control signal.

18. The method according to claim 17 further comprising the step of time averaging the amplitude of the amplified received signal for a time interval substantially greater than the time duration of a Rayleigh fade so that the predetermined level of limiting does not respond to individual Rayleigh fades.

19. The method according to claim 16 further comprising the steps of highpass filtering the recovered audio to remove the audio frequency components, detecting the peak amplitude of the high frequency components remaining after the highpass filtering, and reducing the amplification of the received signal in response to the magnitude of the detected high frequency components.

20. The method according to claim 16 wherein the conversion from an amplified FM signal to an audio signal comprises the step of converting such that the ratio of the magnitude of the audio signal to the magnitude of the amplified FM signal is greater than 1.

21. The method according to claim 20 wherein said conversion substantially follows a square law characteristic.

* * * * *